United States Patent [19]

Corrie

[11] Patent Number: 4,946,716

[45] Date of Patent: Aug. 7, 1990

[54] METHOD OF THINNING A SILICON WAFER USING A REINFORCING MATERIAL

[75] Inventor: Brian L. Corrie, Gaston, Oreg.

[73] Assignee: Tektronix, Inc., Beaverton, Oreg.

[21] Appl. No.: 289,514

[22] Filed: Dec. 27, 1988

Related U.S. Application Data

[63] Continuation of Ser. No. 18,832, Feb. 24, 1987, abandoned, which is a continuation of Ser. No. 740,102, May 31, 1985, abandoned.

[51] Int. Cl.$^5$ .......................... B05D 3/12; B05D 5/12
[52] U.S. Cl. .......................... 427/289; 148/DIG. 135; 156/662; 427/376.2; 437/227; 437/946; 437/974
[58] Field of Search .......................... 427/289, 376.2; 428/446; 437/227, 946, 974; 148/DIG. 135; 156/662

[56] References Cited

U.S. PATENT DOCUMENTS

| | | |
|---|---|---|
| 3,437,527 | 4/1969 | Webb .................................. 136/256 |
| 3,460,003 | 8/1969 | Hampikian et al. .................. 357/73 |
| 3,752,701 | 8/1973 | Morrissey ........................ 427/93 X |
| 3,846,198 | 11/1974 | Wen et al. ............ 148/DIG. 135 X |
| 4,133,690 | 1/1979 | Muller ............................. 427/93 X |
| 4,156,250 | 5/1979 | Trap ...................................... 357/73 |
| 4,263,058 | 4/1981 | Brown et al. .................... 427/88 X |
| 4,321,747 | 3/1982 | Takemura et al. ...................... 437/2 |
| 4,422,091 | 12/1983 | Liu ........................................ 357/24 |
| 4,476,156 | 10/1984 | Brinker et al. ...................... 437/225 |

*Primary Examiner*—Evan Lawrence
*Attorney, Agent, or Firm*—John Smith-Hill; Peter J. Meza; John D. Winkelman

[57] ABSTRACT

A plate-like body (e.g., a silicon wafer) at least about 0.5 mm thick that is to be thinned is reinforced by applying to one main surface, in adhesive relationship thereto, a coating of a finely divided material which is fused to form a hard mechanically supportive coating. The body is thinned from the second main surface to a thickness less than about 250 μm. For a silicon body, the mechanically supportive coating comprises at least about 18% silicon.

13 Claims, 1 Drawing Sheet

METHOD OF THINNING A SILICON WAFER USING A REINFORCING MATERIAL

This is a continuation division of application Ser. No. 018,832 filed Feb. 24, 1987, now abandoned, which is a continuation of application Ser. No. 740,102, filed May 31, 1985, now abandoned.

This invention relates to silicon, wafer reinforcing materials, and more particularly, to a method of thinning a silicon wafer using such material.

BACKGROUND OF THE INVENTION

One form of charge-coupled device (CCD) comprises a silicon die that has been processed using conventional MOS technology to form a buried channel beneath its front surface (the surface through which the die is processed). The channel is made up of a linear array of like elementary regions, and each region has a well defined potential profile including several, e. g. three, potential levels of controlled potential depth. A clocking electrode structure overlies the front surface of the die, and by application of selected potentials to the clocking electrode structure, charge present in a given elementary region may be advanced through the linear array of elementary regions, in the manner of a shift register, and extracted from the channel at an output electrode. Charge may be introduced into the channel at an input electrode that is at the opposite end of the channel from the output electrode, or may be generated photoelectrically. Thus, if electromagnetic radiation is incident on the substrate beneath the channel layer it may cause generation of conduction electrons and these conduction electrons may enter the channel layer and become trapped in a potential well defined between two zones at higher potentials. The diffusion length of the conduction electrons is sufficiently short that a conduction electron generated in the substrate will not pass by diffusion farther than the elementary channel region that immediately overlies the substrate region in which the conduction electron was generated.

A CCD may be constructed with a plurality of parallel buried channels. One application of such a multiple channel CCD, using photoelectrically generated conduction electrons, is as a solid state imager or opto-electric transducer. The die in which the CCD is fabricated is thinned from its back surface, so as to bring the back surface as close as possible to the channel layer, and the die is placed with its back surface at the focal plane of a camera so that the camera lens forms an image of a scene on the back surface of the die. The CCD may comprise, e. g. 512 parallel channels each having 512 elementary regions and the resulting 512 × 512 array of elementary regions resolves the back, or image receiving, surface of the die into 512 × 512 picture elements or pixels. The intensity of the optical energy incident on a given pixel can influence the electron population of the associated elementary region of the channel layer, and so the number of electrons that are transferred out of an elementary region, and ultimately extracted from the CCD, indicate the intensity of the light incident on the pixel. By controlling the timing of the clock pulses in relation to the illumination of the CCD, the CCD can be used to generate an electrical signal representative of the distribution of light intensity over the image receiving surface of the CCD, i. e. of the image formed by the camera lens.

The interface between the channel layer and the substrate of the die is located at a physical depth beneath the first surface of the die in the range from about 5 μm to about 150 μm and therefore in order to maximize the diffusion of photoelectrically-generated conduction electrons into the channel layer it is desirable that the thickness of the silicon die be in the range from about 10 μm to about 160 μm. Since an unprocessed silicon wafer normally has a thickness of about 1 mm because it must be sufficiently thick to be self-supporting during processing, this implies that the wafer must be thinned in order to produce a die having a thickness of 160 μm or less.

It is conventional to carry out thinning of a silicon wafer by grinding or etching. However, in order to thin a wafer to less than about 250 μm, it is necessary to provide the wafer with a mechanical support layer, and it has hitherto been conventional to use a wax support layer. The wax is applied in molten form to the front surface of the wafer, and the wafer is thinned from its back surface. However, waxes that have conventionally been used do not adhere to the wafer particularly well, and therefore when the wafer is thinned to 160 μm or less the silicon die frequently peels from the wax layer and disintegrates. Even if the die does not disintegrate, it may suffer local detachment from the wax layer, with the result that the back surface of the die ceases to be planar, and this may be unacceptable.

In order to minimize dark current generated in the CCD, it is desirable to operate the CCD at a depressed temperature. In order to achieve this, it is conventional to cool the CCD with liquid nitrogen. At standard pressure, liquid nitrogen evaporates at a temperature of about −196 degrees C. Therefore, it may be necessary for a CCD imager to be capable of withstanding temperature changes of over 200 degrees C. This implies that there must be a good matching of the coefficients of thermal expansion between the silicon die and the mechanical support layer, since otherwise differential expansion and contraction will damage the silicon die.

It is not essential that there be a perfect match between the expansion coefficients of the silicon die and the support layer, since some bowing of the back surface of the die can be tolerated. However, the degree of bowing that can be tolerated is quite small, particularly if application of the support layer involves subjecting the wafer to an elevated temperature, so that the wafer is bowed upon cooling to ambient temperature, since it is difficult to thin a bowed wafer.

In U.S. Pat. No. 4,422,091 it is proposed that a CCD imager that has been fabricated using heteroepitaxial gallium arsenide technology should be supported during thinning by means of a plate of molybdenum, aluminum or glass that is bonded to the die using epoxy adhesive or a bonding alloy, for example. U.S. Pat. No. 4,422,091 also proposes that the CCD die be supported during thinning using a GaAs or Si chip that has its own signal conditioning and amplification circuit incorporated therein.

SUMMARY OF THE INVENTION

In a preferred embodiment of the invention, a plate-like silicon body that is to be thinned is reinforced by applying to one face of the body a mechanically-supportive coating that comprises at least about 40 weight percent silica in finely divided form, and processing the coating to form a hard, mechanically-supportive mass that adheres to the body. The body is then thinned from the second face of the body.

BRIEF DESCRIPTION OF THE DRAWING

For a better understanding of the invention, and to show how the same may be carried into effect, reference will now be made, by way of example, to the accompanying drawings in which.

DETAILED DESCRIPTION

Figure 1:
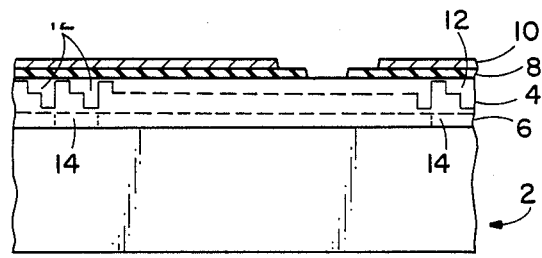
FIG. 1 is a diagrammatic partial sectional view of a buried channel CCD die.
Figure 2:
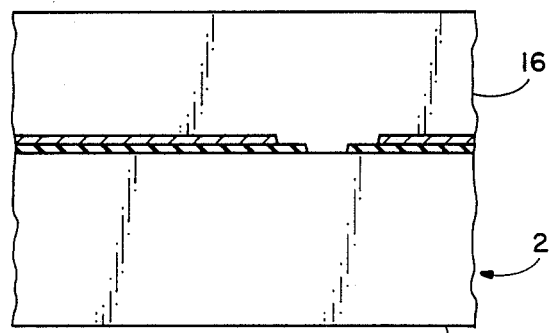
FIG. 2 is a view similar to FIG. 1 showing a coating layer attached to the die.
Figure 3:
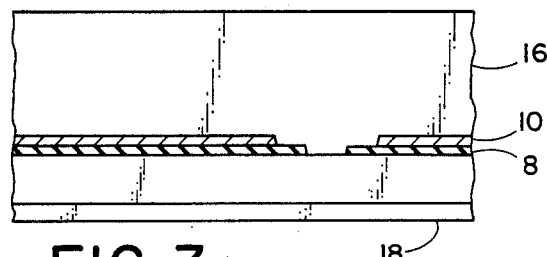
FIG. 3 is a view similar to FIG. 1 after thinning of the die.

The CCD die 2 shown in FIG. 1 is fabricated using conventional MOS technology from a wafer of undoped silicon by implanting a p-type impurity into the wafer by way of its front surface to form a p-type layer 6 and then implanting an n-type impurity to form an n-type channel layer 4. The concentration of n-type impurity varies in controlled fashion along the channel so as to define identical elementary regions 12 that overlie associated elementary areas 14 of the layer 6. Typically, the die comprises a rectangular or square array of from about 250,000 to 4 million elementary devices (region 12 plus associated area 14), and each elementary device has a depth perpendicular to the first surface of the die of about 5 to 150 $\mu$m and occupies a space that has a footprint, at the processed face of the device, of about 50 to 150 $\mu$m by 50 to 150 $\mu$m. The front surface of the CCD may be from about 2.75 mm on a side to about 5 cm on a side, and from one to about nine identical devices would normally occupy the processible area of a typical four inch (about 10 cm) diameter wafer.

Overlying the front surface of the wafer is a layer 8 of silicon oxide and a layer 10 of refractory metal such as molybdenum or tungsten. The layer 10 is passivated at its exposed surface. It will be appreciated by those skilled in the art that the layers 8 and 10 would not normally be continuous, but would be patterned, so that in different regions of the front surface silicon, silicon dioxide and passivated metal are exposed. However, the nature of the patterning is not relevant to the invention and therefore the patterning is not shown in detail. It will also be understood that some dimensions are shown out of proportion in the drawing for the sake of clarity.

After completing the usual steps of cleaning, masking, implantation, diffusion, oxidation and metallizing that are associated with processing of the wafer using conventional MOS technology, the wafer is scribed at its front surface to a depth of about 10 $\mu$m so as to facilitate later detachment of each CCD die from surplus wafer material and other CCD dice that are on the same wafer, and a reinforcing coating 16 is applied over the front surface of the processed wafer. The coating material preferably comprises a silica-based glass that, when fused, forms a hard mass that adheres to the front surface of the die. It has been found that a suitable glass is a borosilicate glass containing from about 40 to about 60 weight percent silica. The relatively high proportion of silicon (about 18 to about 28 weight percent) in the glass insures that there is a good match between the coefficient of thermal expansion of the die and that of the glass. The particular borosilicate glass that is used is selected to have a fusion temperature that is below the temperature at which the refractory metallization of the CCD is degraded.

The borosilicate glass is applied to the front surface of the processed wafer in the form of a paste or slurry of ground glass dispersed in a vehicle of nitrocellulose and a solvent. The paste is applied to a depth from about 30 to about 60 mils (one mil is equal to 0.001 inches, or about 0.025 mm), and the coating thickness is uniform to within about 10 mils. Coating thickness and uniformity are preferably controlled using a doctor blade. The wafer is placed with its front surface upwards on a horizontal platform between two narrow ridges that extend above the surface of the platform to a uniform, equal height of about 1.4 mm. A slurry of ground glass and liquid vehicle is placed on the front surface of the wafer, and a metal blade having a straight edge is placed with its straight edge bridging the gap between the ridges. The blade is run over the slurry and spreads the slurry over the front surface of the wafer to a uniform depth equal to the difference between the height of the ridges and the thickness of the wafer. In the case of a wafer that is 20 mil (about 0.5 mm) thick, the slurry layer has a thickness of about 36 mil (0.9 mm). The wafer is then placed in an oven and baked at about 360 degrees C. for 60 minutes in order to drive off the vehicle, leaving just the ground glass on the front surface of the wafer. The temperature in the oven is raised to about 700 to 950 degrees C. (depending on the glass that is selected) and the ground glass is fused. The fused glass adheres firmly to the front surface of the wafer.

After fusing the borosilicate glass, the wafer is allowed to cool to ambient temperature (about 20 degrees C.). At ambient temperature, the four inch (about 10 cm) diameter wafer is bowed slightly, with its front surface convex (indicating that the expansion coefficient of the coating is slightly less than that of silicon), but the center of the back surface of the wafer is only about 1 mil from the plane containing the periphery of the back surface of the wafer. This small degree of bowing is not sufficient to interfere with thinning of the wafer. The close match in coefficients of expansion is obtained because the coating contains a large proportion of silicon.

The cooled wafer is thinned from the face opposite the processed face, i. e. the back surface 18, until the scribed lines can be seen, and the wafer and the coating are then severed along the scribed lines to remove surplus material and, in the event that more than one CCD die is formed, separate the individual CCD dice. After removal of surplus material, and separation of individual CCD dice if appropriate (but leaving the coating attached), the CCD may be packaged using conventional techniques.

Upon cooling of the die and its glass coating down to the temperature of liquid nitrogen ($-196$ degrees C.), no unacceptable warping of the CCD die is observed, and the die remains attached to the glass coating.

It will be appreciated that the invention is not restricted to the particular methods and devices that have been described, and that variations may be made therein without departing from the scope of the invention as defined in the appended claims, and equivalents thereof.

I claim:

1. A method of thinning a plate-like body of a given material at least about 0.5 mm thick, comprising forming a coating on one main face of the body, the coating comprising as a component at least about 18 weight percent of said given material and being in finely divided form, fusing the coating material so as to form a mechanically-supportive coating in direct adhesive relationship with said body, and thinning the body from the opposite main face of the body to a thickness in the range from about 10 μm to about 160 μm.

2. A method according to claim 1 wherein said given material is silicon and the coating material is a borosilicate glass.

3. A method of thinning a plate-like body of silicon at least about 0.5 mm thick and having a layer of refractory metal adhered to one main face of the body, comprising applying a coating of finely-divided silica-based material over said layer of refractory metal, fusing the coating material at a temperature below the melting point of the refractory metal so as to form a mechanically-supportive coating in direct adhesive relationship to the refractory metal, and thinning the body from the opposite main face of the body to a thickness in the range from about 10 μm to about 160 μm.

4. A method according to claim 3, wherein the silica-based material is a borosilicate glass containing about 40 weight percent silica.

5. A method according to claim 3, wherein the coating is applied in the form of a slurry or paste.

6. A method of thinning a plate-like body of silicon having first and second opposite surfaces, said body being about 0.5 mm thick and bearing a pattern of metal and silicon dioxide at one surface, and the method comprising providing a finely divided material that comprises at least about 18 weight percent silicon and can be fused at a temperature below the melting point of said metal to form a liquid that wets both said metal and silicon dioxide and on cooling forms a hard, homogeneous mass that adheres to both said metal and silicon dioxide, applying said material as a coating to said first surface of the body, fusing the finely divided material at a temperature below the melting point of said metal, allowing the body and the fused material to cool, and thinning the body from its second surface to a thickness in the range from about 10 μm to about 160 μm.

7. A method of thinning a plate-like body of silicon at least about 0.5 mm thick and having first and second main surfaces, comprising applying to the first main surface of the body a coating of a finely divided material that comprises at least about 40 weight percent of silica, processing the coating material to form a hard, mechanically-supportive mass that is in adhesive relationship with first main surface, and thinning the body from its second main surface to a thickness in the range from about 10 μm to about 160 μm.

8. A method according to claim 7, wherein said material is a borosilicate glass.

9. A method of thinning a plate-like body of a given material at least about 0.5 mm thick and having first and second opposite main surfaces, comprising providing a coating material that comprises as a component at least about 18 weight percent of said given material, applying the coating material to the first main surface of the body in finely divided form, processing the coating material to form a hard, mechanicallysupportive mass that is in adhesive relationship with said first main surface, and thinning the body from its second main surface to a thickness in the range from about 10 μm to about 160 μm.

10. A method according to claim 9, wherein said given material is silicon and the coating material is a silicabased material.

11. A method according to claim 10, wherein the coating material is a borosilicate glass.

12. A method of thinning a wafer that is at least about 0.5 mm thick and has electronic circuit means integrated therein subjacent a front face of the wafer, comprising applying a layer of a glass material to the front face of the wafer, the glass material being in finely divided form and having a coefficient of thermal expansion that matches closely that of the material of the wafer, fusing the glass material so as to form a mechanically-supportive coating in direct adhesive relationship with the wafer, and thinning the wafer from its back face to a thickness less than about 250 μm.

13. A method according to claim 12, comprising thinning the wafer to a thickness of the range from about 10 μm to about 160 μm.

* * * * *